(12) United States Patent
Agostini et al.

(10) Patent No.: US 10,096,538 B2
(45) Date of Patent: Oct. 9, 2018

(54) COOLING OF WIDE BANDGAP SEMICONDUCTOR DEVICES

(71) Applicant: ABB Schweiz AG, Baden (CH)

(72) Inventors: Bruno Agostini, Zürich (CH); Daniele Torresin, Birmenstorf (CH); Francesco Agostini, Zürich (CH); Mathieu Habert, Rixheim (FR); Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/485,676

(22) Filed: Apr. 12, 2017

(65) Prior Publication Data
US 2017/0301607 A1    Oct. 19, 2017

(30) Foreign Application Priority Data
Apr. 13, 2016 (EP) .................................... 16165167

(51) Int. Cl.
*H01L 23/427* (2006.01)
*H01L 29/16* (2006.01)
(Continued)

(52) U.S. Cl.
CPC .......... *H01L 23/427* (2013.01); *F25B 25/005* (2013.01); *H01L 23/473* (2013.01); *H01L 29/1608* (2013.01); *H01L 29/7393* (2013.01); *H01L 29/78* (2013.01); *H05K 7/20936* (2013.01); *H01L 29/2003* (2013.01); *H01L 29/22* (2013.01)

(58) Field of Classification Search
CPC .......... H05K 7/029; H05K 7/20309–7/20318; H05K 7/20254; H05K 7/20936; H05K 1/0203; H01L 23/427; H01L 23/473

USPC ....... 361/699–702, 717–718; 165/80.4–80.5, 165/104.33; 257/714–715; 174/252
See application file for complete search history.

(56) References Cited

U.S. PATENT DOCUMENTS

2011/0254147 A1* 10/2011 Otsuka .................... H01L 21/50
                                                                    257/692
2012/0057386 A1*  3/2012 Adachi ............... H01L 29/1608
                                                                    363/131
(Continued)

FOREIGN PATENT DOCUMENTS

DE    102013208369 A1   11/2014
WO       2010034569 A1    4/2010

OTHER PUBLICATIONS

European Patent Office, Search Report issued in corresponding Application No. 16165167.4, dated Sep. 27, 2016, 5 pp.

*Primary Examiner* — Dion R Ferguson
*Assistant Examiner* — Amir Jalali
(74) *Attorney, Agent, or Firm* — J. Bruce Schelkopf; Taft Stettinius & Hollister LLP

(57) ABSTRACT

A power device comprises at least one power semiconductor module comprising a wide bandgap semiconductor element; and a cooling system for actively cooling the wide bandgap semiconductor element with a cooling medium, wherein the cooling system comprises a refrigeration device for lowering a temperature of the cooling medium below an ambient temperature of the power device; wherein the cooling system is adapted for lowering the temperature of the cooling medium in such a way that a temperature of the wide bandgap semiconductor element is below 100° C.

19 Claims, 3 Drawing Sheets

(51) Int. Cl.
　　*H01L 29/739*　　(2006.01)
　　*H01L 29/78*　　(2006.01)
　　*H05K 7/20*　　(2006.01)
　　*F25B 25/00*　　(2006.01)
　　*H01L 23/473*　　(2006.01)
　　*H01L 29/20*　　(2006.01)
　　*H01L 29/32*　　(2006.01)
　　*H01L 29/22*　　(2006.01)

(56) References Cited

U.S. PATENT DOCUMENTS

| | | | | |
|---|---|---|---|---|
| 2012/0186290 | A1* | 7/2012 | Howes | B60H 1/00278 62/259.2 |
| 2012/0236615 | A1* | 9/2012 | Kitabatake | H01L 27/088 363/131 |
| 2012/0307540 | A1* | 12/2012 | Tagome | H02M 1/088 363/131 |
| 2013/0009624 | A1* | 1/2013 | Tagome | B60L 3/00 323/350 |
| 2013/0319635 | A1* | 12/2013 | Kobayashi | H01L 23/473 165/104.11 |
| 2014/0319673 | A1* | 10/2014 | Zhou | H01L 23/4334 257/712 |
| 2015/0115289 | A1* | 4/2015 | Fursin | H01L 29/7395 257/77 |
| 2015/0282290 | A1* | 10/2015 | Borowy | H05H 1/34 219/121.39 |
| 2015/0365003 | A1* | 12/2015 | Sadwick | H02M 3/28 363/21.01 |
| 2016/0087537 | A1* | 3/2016 | Barkley | H02M 3/33507 363/21.12 |
| 2016/0286694 | A1* | 9/2016 | Krishnan | H05K 7/20772 |
| 2017/0085090 | A1* | 3/2017 | Marzouk | H02M 3/04 |
| 2017/0279287 | A1* | 9/2017 | Solodovnik | H02J 7/0052 |

* cited by examiner

COOLING OF WIDE BANDGAP SEMICONDUCTOR DEVICES

FIELD OF THE INVENTION

The invention relates to the field of wide bandgap semiconductor devices. In particular, the invention relates to a power device as well as to a method for cooling and/or operating a wide bandgap semiconductor element.

BACKGROUND OF THE INVENTION

Power devices with semiconductor elements based on wide bandgap materials, such as SiC, provide low switching losses making them suitable for high frequency applications and low leakage currents for higher temperature operational requirements. For example, an SiC MOSFET provides very low losses at low currents compared to bipolar switches such as an Si IGBT.

However, at higher currents, SiC unipolar devices usually have a strong positive temperature coefficient, which may increase conduction losses at higher temperatures. These conduction losses even may increase with semiconductor elements rated with high voltage, due to the increased thicknesses of the n-base of the semiconductor element.

DESCRIPTION OF THE INVENTION

It is an objective of the invention to provide high power wide bandgap semiconductor devices with low losses.

This objective is achieved by the subject-matter of the independent claims. Further exemplary embodiments are evident from the dependent claims and the following description.

An aspect of the invention relates to a power device, i.e. a device comprising power semiconductors. A power device may be an electrical converter (for example for converting a DC voltage into an AC voltage and/or vice versa). The electrical converter may be a multi-level converter, in particular a modular multi-level converter. The term "power" may relate to devices, which are adapted for processing voltages above 1000 V and/or currents above 100 A.

According to an embodiment of the invention, the power device comprises at least one power semiconductor module comprising a wide bandgap semiconductor element. A power semiconductor module may comprise one or more semiconductor elements and components mechanically supporting these semiconductor elements, electrically interconnecting these semiconductor elements and/or cooling these semiconductor elements. Usually, a power device is assembled of a plurality of these modules.

A wide bandgap semiconductor element may be a semiconductor chip optionally together with its metalized contact areas. Wide bandgap semiconductor elements may be based on semiconductor materials with a bandgap larger than 3 eV, such as SiC, GaN, InGaN, BN, AlN, ZnO.

According to an embodiment of the invention, the power device further comprises a cooling system for actively cooling the wide bandgap semiconductor element with a cooling medium, wherein the cooling system comprises a refrigeration device for lowering a temperature of the cooling medium below an ambient temperature of the power device, wherein the cooling system is adapted for lowering the temperature of the cooling medium in such a way that a (junction) temperature of the wide bandgap semiconductor element is below 100° C.

The cooling system may comprise one or more cooling circuits, in which a cooling medium (such as a liquid as cooling water mixed optionally with glycol) is circulating, for example conveyed by a pump. The cooling system not only cools the cooling medium to an ambient temperature (for example to a temperature of air surrounding the semiconductor device), but to a temperature below this ambient temperature, which for example may be lower than 50° C., for example lower than 40° C. This is done with a refrigeration device, which, for example, may be based on vapor-compression refrigeration or a Peltier element.

The cooling is performed, such that a temperature of the wide bandgap element is below 100° C. or below 80° C., ideally below 60° C. The temperature of the wide bandgap element may be a temperature inside its semiconductor material, for example at its junction, i.e. a junction temperature.

In such a way, the wide bandgap element may be operated with low conduction losses, in particular at low switching frequencies (such as below 500 Hz or below 300 Hz), when the conduction losses may dominate the switching losses.

Furthermore, a lower temperature operation may also provide benefits with respect to service and reliability, compared to higher temperature operation of the semiconductor elements. This may enable higher design tolerances at chip, packaging and system level designs.

According to an embodiment of the invention, the wide bandgap semiconductor element comprises a unipolar semiconductor switch and/or is based on SiC. For example, the wide bandgap semiconductor element may comprise an SiC MOSFET. For example, the power device may be an electrical converter employing one or more unipolar wide bandgap semiconductor switches, such as SiC MOSFETs, where the maximum junction temperature is limited to below 100° C.

According to an embodiment of the invention, the power semiconductor element comprises a combination of a unipolar wide bandgap switch and a bipolar switch. The wide bandgap semiconductor element may be in a cross switch hybrid combination, for example, an Si bipolar switch and an SiC unipolar switch connected in parallel.

In general, the power device may solely comprise power semiconductor elements in the form of wide bandgap elements, such as SiC MOSFETs.

According to an embodiment of the invention, the voltage rating of the power device is above 2 kV, above 5 kV or above 10 kV. In particular, the power device may be applied in grid systems of high voltage. For example, the power device may be a HVDC (high voltage DC) device or a FACT (flexible AC transmission) device.

According to an embodiment of the invention, the refrigeration device is based on vapor compression. For example, the cooling system may comprise a cooling circuit with a compressor and a relief valve.

According to an embodiment of the invention, the cooling system comprises a first cooling circuit for cooling the at least one power semiconductor module. The first cooling circuit may comprise a pump, which pumps a cooling liquid through the one or more power semiconductor modules.

According to an embodiment of the invention, the cooling system comprises a second cooling circuit for cooling the first cooling circuit, which is in thermal contact with the first cooling circuit via an internal exchanger. For example, the second cooling circuit may comprise the refrigeration device.

According to an embodiment of the invention, the second cooling circuit comprises an external heat exchanger adapted for heat exchanging with ambient air of the power device. The cooling medium in the second cooling circuit may be cooled by ambient air and/or the temperature after the refrigeration device may be below 0° C.

For example, the one or more wide bandgap semiconductor elements may operate at 50° C. junction temperature and/or may be directly cooled by a (first) pumped water/glycol liquid circuit being cooled below 0° C. by a (second) vapor compression circuit, which is cooled by ambient air. For example, the ambient air may have a temperature up to 40° C.

A further aspect of the invention relates to a method for cooling at least one power semiconductor module comprising a wide bandgap semiconductor element, for example, a semiconductor module as described in the above and in the following.

According to an embodiment of the invention, the method comprises: lowering, with a refrigeration device, a temperature of a cooling medium below an ambient temperature of a power device comprising the wide bandgap semiconductor element; and cooling the wide bandgap semiconductor element with the cooling medium such that a (junction) temperature of the wide bandgap semiconductor element is below 100° C. By lowering the temperature of a cooling medium below an ambient temperature, the wide bandgap elements may be operated at a temperature that is not much higher than the ambient temperature. In such a way, the one or more wide bandgap elements may have low current losses compared to operating them at high temperatures.

According to an embodiment of the invention, the wide bandgap device is cooled such that its temperature is above 20° C., i.e. may be in the same temperature range as the ambient temperature.

According to an embodiment of the invention, the cooling medium is cooled below 0° C. By cooling the cooling medium strong below the ambient temperature, the wide bandgap elements may be cooled to a temperature near the ambient temperature.

A further aspect of the invention relates to a method for operating a power device, for example as described in the above and in the following.

According to an embodiment of the invention, the method comprises: operating the wide bandgap semiconductor element with a switching frequency below 500 Hz and cooling the wide bandgap semiconductor element below a temperature of 100° C. as described in the above and in the below. In particular, when the switching frequency is rather low, such as below 500 Hz, below 250 Hz or below 100 Hz (for example as usually used in a MMC topology), the current losses may dominate the switching losses and the cooling below 100° C. may reduce the overall losses of the power device.

It has to be noted that the power semiconductor elements may be operational in both switch and diode modes with no external diode. Furthermore, the semiconductor elements need not be switched actively, but may be switched by a current flowing through it.

It may be possible that the cooling below the temperature of 100° C. (or below 80° C. or below 60° C.) solely may be performed, when the switching frequency is below 500 Hz (or below 250 Hz or below 100 Hz), i.e. it may be possible that the cooling is stopped, when the switching frequency is higher.

In general, the cooling may be adjusted depending of the application, for example the operation mode of the power device.

According to an embodiment of the invention, the power device comprises a controller for controlling a switching of the wide bandgap semiconductor element, wherein the power device is adapted for performing the method as described in the above and in the following under the control of the controller. The controller may generate the gate signals for the one or more power semiconductor elements and/or may control the pumps and/or compressors of the cooling system. It has to be understood that features of the methods for cooling and/or operating a power device as described in the above and in the following may be features of the power device as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
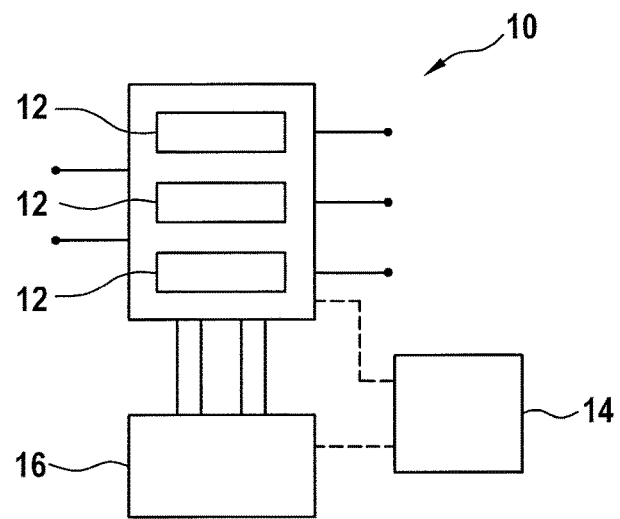
FIG. 1 schematically shows a power device according to an embodiment of the invention.

FIG. 1 shows a power device 10 comprising a plurality of semiconductor modules 12, a controller 14 and a cooling system 16.

For example, the power device 10 may be an inverter for converting a DC current into an AC current (or vice versa). The cooling system 16 may be adapted for cooling the semiconductor modules 12, for example by pumping a cooling liquid through the semiconductor modules 12. The controller 14 may be adapted for controlling the semiconductor modules 12, for example by providing gate signals to them and/or for controlling the cooling system 16. For example, the controller may control the temperature of the semiconductor modules 12 by controlling the amount of cooling liquid flowing through the power semiconductor modules 12.

Figure 2:
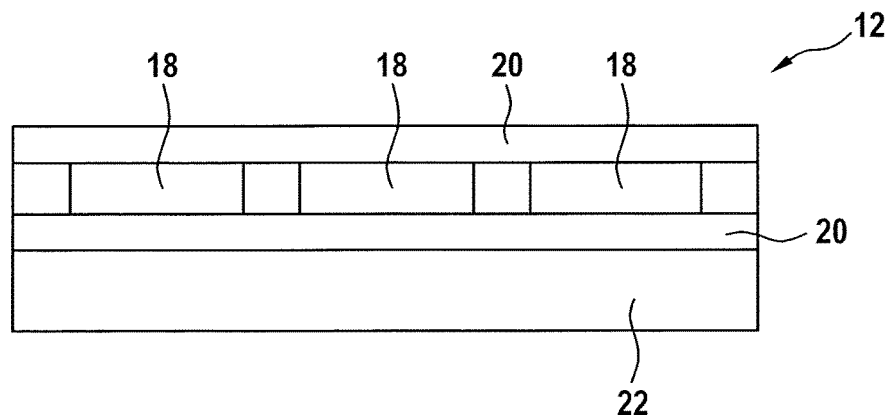
FIG. 2 schematically shows a power semiconductor module for the power device of FIG. 1.

FIG. 2 shows a power semiconductor module 12, which comprises a plurality of semiconductor elements 18, which may comprise wide bandgap semiconductor elements and semiconductor elements with normal bandgap. The semiconductor elements 18 are mechanically supported by further components 20 of the power semiconductor module 12, which also may provide electrical connections for the semiconductor elements 18.

Furthermore, the power semiconductor module 12 comprises a cooling body 22 which may be cooled by cooling liquid pumped by the cooling system 16 through the cooling body 22. The semiconductor elements 18 may be cooled by the cooling body 22 in such a way that the junction temperature inside their body is below 100° C.

Figure 3A:
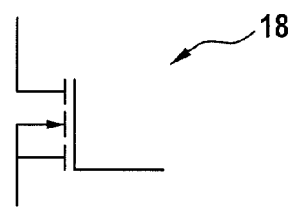
FIG. 3A schematically shows a power semiconductor element for the power device of FIG. 1.

FIG. 3A symbolically shows a semiconductor element 18, which comprises a unipolar wide bandgap semiconductor element in the form of an SiC MOSFET. It may be possible that the power semiconductor module 12 solely comprises wide bandgap devices.

Figure 3B:
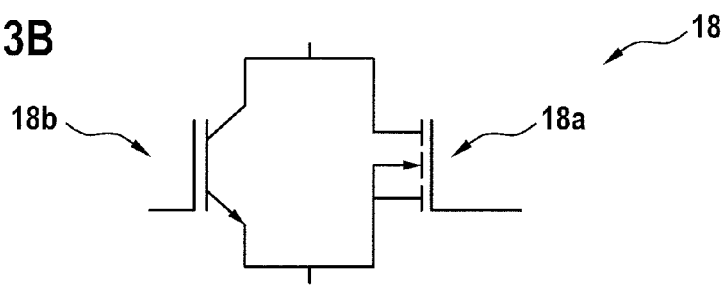
FIG. 3B schematically shows a further power semiconductor element for the power device of FIG. 1.

FIG. 3B symbolically shows a further semiconductor element 18, which comprises a unipolar wide bandgap semiconductor element 18a in the form of an SiC MOSFET and a "normal" semiconductor element 18b in the form of an Si IGBT, which are connected in parallel. Such a combination of elements 18a, 18b may have benefits in view of switching losses and switching speed.

Figure 4:
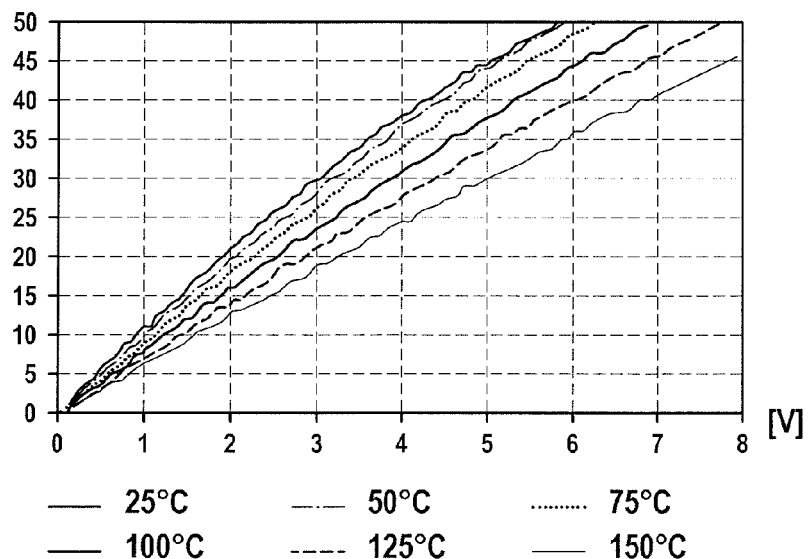
FIG. 4 shows a diagram indicating the current losses in dependence of temperature of a wide bandgap element used in the power device of FIG. 1.

FIG. 4 shows a diagram with measured current-bias-curves of a 3300 V 25 mm² SiC MOSFET with an applied gate voltage of 15 V. The y-axis shows the drain-source current, while the x-axis shows the bias, i.e. the voltage difference between drain and source. In general, the current losses are proportional to the slope of the curves.

The diagram shows the curves between 25° C. and 150° C. A large increase in current losses is observed above 100° C. while only a small increase is observed between 25° C. and 50° C. Hence, the optimum range for the operation temperature in view of current losses may lie in the temperature range between 50° C. and 100° C. To obtain similar current losses at higher temperatures (such as above 125° C.), a large increase in effective area of the semiconductor elements and hence cost may be required.

Furthermore, at lower temperatures below 100° C., further reduction of current losses may be achievable with increased gate voltages/gate signals up to 20 V. This advantage may not be present at higher temperatures (such as above 125° C.), and therefore further loss reductions may be possible.

The behaviour of the current losses in view of temperature also may be present in a diode channel MOS operation mode during a diode freewheeling mode of operation, which may result in an overall advantage for all or nearly all operational modes of the semiconductor elements 18.

Thus, in cases when switching losses may be small compared to current losses, it may be beneficial to cool the wide bandgap semiconductor elements 18a between 20° C. and 100° C., for example between 40° C. and 80° C. or between 50° C. and 60° C.

Figure 5:
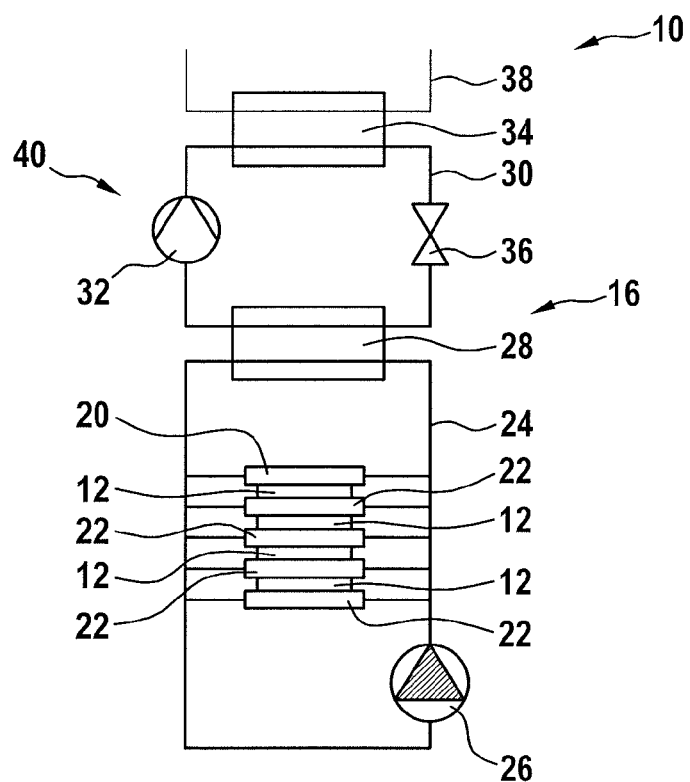
FIG. 5 schematically shows a further power device according to an embodiment of the invention.

FIG. 5 shows a power device 10 with a cooling system 16 that comprises two separate cooling circuits 24, 30.

A first cooling circuit 24 comprises a pump 26, for pumping a cooling liquid (such as a water-glycol mixture) through the power semiconductor modules 12 (or in particular their cooling bodies) to cool the semiconductor elements to a desired temperature (such as 50° C.).

The first cooling circuit 24 is thermally connected with an internal heat exchanger 28 with a second cooling circuit 30. The refrigerant in the second cooling circuit 30 may have a temperature of about −35° C. and the cooling liquid in the first cooling circuit 24 may be cooled to about −30° C. by the heat exchanger.

The refrigerant in the second cooling circuit 30 may be compressed by a compressor 32, may be cooled in an ambient heat exchanger 34 to an ambient temperature of about 40° C. and may be decompressed in a relief valve 36 for lowering the temperature to about −35° C. before being supplied to the internal heat exchanger 28. In the compressor, a vapor may be liquefied, which liquid is vaporized in the relief valve.

The ambient heat exchanger 34 may be adapted for being cooled by ambient air 38, which, for example, may have a temperature of up to 40° C.

In general, the compressor 32 and the relief valve 36 may be seen as a refrigeration device 40 adapted for lowering the temperature in the first cooling circuit 24 at the heat exchanger 28 below the ambient temperature.

Figure 6:
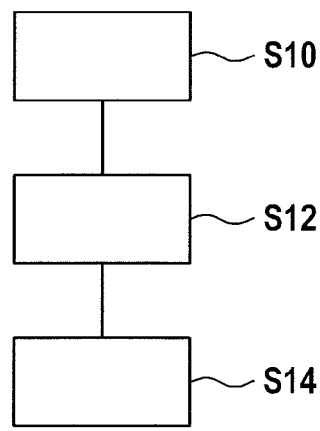
FIG. 6 shows a flow diagram for a method for operating/cooling a power device according to an embodiment of the invention.

FIG. 6 shows a flow diagram for a method for operating the power device 10.

In step S10, the controller 14 operates the wide bandgap semiconductor elements 18, for example by applying a gate signal with voltage of about 20 V to the power semiconductor element.

For example, when the device 10 is an inverter, the semiconductor elements 18 of the power semiconductor modules 12 may be switched in such a way that a DC voltage is converted into an AC voltage or vice versa.

In step S12, the refrigeration device 40 lowers a temperature of the cooling medium in the first cooling circuit 24 below the ambient temperature of the power device 10. For example, the cooling medium of the first cooling circuit may be cooled below 0° C. in the heat exchanger 28.

In step S14, the wide bandgap semiconductor elements 18 are cooled with the cooling medium in the first cooling circuit 24 such that a temperature of the wide bandgap semiconductor elements 18 is below a desired temperature (such as 100° C.). For example, the semiconductor elements 18 may be cooled to a temperature within one of the above mentioned intervals. This temperature may be in the range of the ambient temperature, for example above 20° C.

It may be possible that the semiconductor elements 18 may be switched with any switching frequency, but when the switching frequency (for a longer time) falls below 500 Hz, below 250 Hz or below 100 Hz, the controller 14 changes a cooling mode and starts to operate the cooling system 16 that the wide bandgap semiconductor elements 18 are cooled to the desired low temperature (such as below 100° C.). In the case, when the switching frequency is higher, the controller 14 may change into another operation mode, in which the semiconductor elements 18 are less cooled and may have a temperature above 100° C. In general, the controller may change the cooling dependent on an operation mode of the power device 10.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures

LIST OF REFERENCE SYMBOLS 10 power device
12 power semiconductor module
14 controller
16 cooling system
18 wide bandgap semiconductor element
18a SiC MOSFET
18b Si IGBT
20 component of power semiconductor module
22 cooling body
24 first cooling circuit
26 pump
28 heat exchanger
30 second cooling circuit
32 compressor
34 heat exchanger
36 relief valve
38 ambient air
40 refrigeration device

The invention claimed is:

1. A power device, comprising:
   at least one power semiconductor module comprising a wide bandgap semiconductor element;
   a cooling system for actively cooling the wide bandgap semiconductor element with a cooling medium, wherein the cooling system comprises a refrigeration device for lowering a temperature of the cooling medium below an ambient temperature of the power device;
   wherein the cooling system is adapted for lowering the temperature of the cooling medium in such a way that a temperature of the wide bandgap semiconductor element is below 100° C.

2. The power device of claim 1, wherein the wide bandgap semiconductor element comprises a unipolar semiconductor switch and/or is based on SiC.

3. The power device of claim 2, wherein the wide bandgap semiconductor element comprises an SiC MOSFET.

4. The power device of claim 1, wherein the wide bandgap semiconductor element comprises an SiC MOSFET.

5. The power device according to claim 1, wherein the power semiconductor element comprises a combination of a unipolar wide bandgap switch and a bipolar switch.

6. The power device according to claim 1, wherein the voltage rating of the power device is above 2 kV.

7. The power device according to claim 1, wherein the refrigeration device is based on vapor compression.

8. The power device according to claim 1, wherein the cooling system comprises a first cooling circuit for cooling the at least one power semiconductor module;
   wherein the cooling system comprises a second cooling circuit for cooling the first cooling circuit, which is in thermal contact with the second cooling circuit via an internal exchanger.

9. The power device of claim 8, wherein the second cooling circuit comprises the refrigeration device.

10. The power device of claim 9, wherein the second cooling circuit comprises an external heat exchanger adapted for heat exchanging with ambient air of the power device.

11. The power device of claim 1, wherein the power semiconductor element comprises a combination of a unipolar wide bandgap switch and a bipolar switch;
   wherein the voltage rating of the power device is above 2 kV; and
   wherein the refrigeration device is based on vapor compression.

12. The power device of claim 1, wherein the cooling system comprises a first cooling circuit for cooling the at least one power semiconductor module;
   wherein the cooling system comprises a second cooling circuit for cooling the first cooling circuit, which is in thermal contact with the second cooling circuit via an internal exchanger.

13. A method for cooling at least one power semiconductor module comprising a wide bandgap semiconductor element, the method comprising:
   lowering, with a refrigeration device, a temperature of a cooling medium below an ambient temperature of a power device comprising the wide bandgap semiconductor element;
   cooling the wide bandgap semiconductor with the cooling medium such that a temperature of the wide bandgap semiconductor element is below 100° C.

14. The method of claim 13, wherein the wide bandgap element is cooled such that its temperature is above 20° C.

15. The method of claim 14, wherein the cooling medium is cooled below 0° C.

16. The method of claim 13, wherein the cooling medium is cooled below 0° C.

17. A method for operating a power device, the method comprising:
   operating a wide bandgap semiconductor element with a switching frequency below 500 Hz;
   cooling the wide bandgap semiconductor element below a temperature of 100° C. by lowering, with a refrigeration device, a temperature of a cooling medium below an ambient temperature of the wide bandgap semiconductor element; and
   cooling the wide bandgap semiconductor with the cooling medium.

18. A power device comprising:
   at least one power semiconductor module comprising a wide bandgap semiconductor element;
   a cooling system for actively cooling the wide bandgap semiconductor element with a cooling medium, wherein the cooling system comprises a refrigeration device for lowering a temperature of the cooling medium below an ambient temperature of the power device, the cooling system is adapted for lowering the temperature of the cooling medium in such a way that a temperature of the wide bandgap semiconductor element is below 100° C.;
   a controller for controlling a switching frequency of the wide bandgap semiconductor element, wherein the power device is adapted for performing the operations under the control of the controller comprising:
   operate the wide bandgap semiconductor element with a switching frequency below 500 Hz;
   cool the wide bandgap semiconductor element below 100° C. by lowering, with the refrigeration device, a temperature of the cooling medium below the ambient temperature of the wide bandgap semiconductor element; and
   cool the wide bandgap semiconductor with the cooling medium.

19. The power device of claim 18 being an electrical converter.

* * * * *